(12) United States Patent
Shibata

(10) Patent No.: US 6,700,189 B2
(45) Date of Patent: Mar. 2, 2004

(54) RESIN SEALED SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 63 days.

(21) Appl. No.: 09/970,193

(22) Filed: Oct. 4, 2001

(65) Prior Publication Data
US 2002/0041011 A1 Apr. 11, 2002

(30) Foreign Application Priority Data
Oct. 10, 2000 (JP) .......................... 2000-308925

(51) Int. Cl.⁷ .................. H01L 23/48; H01L 23/495; H01L 23/50
(52) U.S. Cl. ............... 257/684; 257/696; 257/666; 257/676; 257/796; 257/698; 257/775; 257/787
(58) Field of Search ................. 257/666, 676, 257/684, 690, 696, 698, 734, 775, 787, 796, 737, 738, 788

(56) References Cited

U.S. PATENT DOCUMENTS

| 6,081,029 A | * | 6/2000 | Yamaguchi | 257/666 |
|---|---|---|---|---|
| 6,175,150 B1 | * | 1/2001 | Ichikawa et al. | 257/676 |
| 6,198,171 B1 | * | 3/2001 | Huang et al. | 257/787 |
| 6,201,294 B1 | * | 3/2001 | Lee | 257/669 |
| 6,204,554 B1 | * | 3/2001 | Ewer et al. | 257/705 |
| 6,208,020 B1 | * | 3/2001 | Minamio et al. | 257/796 |
| 6,208,023 B1 | * | 3/2001 | Nakayama et al. | 257/696 |
| 6,247,229 B1 | * | 6/2001 | Glenn | 257/666 |
| 6,281,568 B1 | * | 8/2001 | Glenn et al. | 257/684 |
| 6,399,423 B2 | * | 6/2002 | Matsuura et al. | 438/123 |
| 6,437,429 B1 | * | 8/2002 | Su et al. | 257/666 |
| 2002/0024127 A1 | * | 2/2002 | Sakuraba et al. | 257/686 |

* cited by examiner

Primary Examiner—Alexander Oscar Williams
(74) Attorney, Agent, or Firm—Rabin & Berdo, PC

(57) ABSTRACT

A semiconductor device in which a lead frame having inner connecting portions and outer connecting portions, a semiconductor chip having electrodes on the surface thereof, and metal wires for electrically connecting electrodes on the semiconductor chip and the inner connecting portions of the lead frame are sealed with a sealing resin. The bottom side of the sealing resin of the inner connecting portion is covered with an inner connecting portion sealing resin.

13 Claims, 6 Drawing Sheets

RESIN SEALED SEMICONDUCTOR DEVICE

BACKGROUND OF THE INVENTION

1. Field of the Invention

The present invention relates to a resin-sealed type semiconductor device in which a semiconductor chip and a part of a lead frame are sealed with a resin, and especially to a one-side sealed type semiconductor device in which a surface of a lead frame on which a semiconductor chip is mounted is sealed with a resin.

2. Description of Related Art

Resin-sealed type semiconductor devices in which a semiconductor chip and a part of a lead frame are sealed with a resin are widely used. Recently, as thin-type apparatus have come into general use, semiconductor devices mounted on these apparatus have also been requested to be thin-type. In conventional resin-sealed type semiconductor devices, generally both of the upper and lower portions of a semiconductor chip and a lead frame in the vicinity thereof are sealed with a resin. However, so-called one-side sealed type semiconductor devices have been developed which are made thin by sealing mainly the upper surface (the surface on which a semiconductor chip is mounted) of a lead frame.

FIG. 7 is a schematic sectional view showing the structure of a conventional one-side sealed type semiconductor device 50.

This semiconductor device 50 comprises a lead frame 51 having a supporting portion 52 and lead terminal portions 53, a semiconductor chip 54 mounted on the supporting portion 52, metal wires 55 for electrically connecting electrodes formed on the upper surface 54a of the semiconductor chip 54 and the upper surfaces 53a of the lead terminal portions 53 respectively, and a sealing resin 56 for sealing the semiconductor chip 54, metal wires 55, and a part of the upper surface of the lead frame 51.

The lead frame 51 has such a structure that the supporting portion 52 is disposed in the central portion thereof, and the lead terminal portions 53 are surrounding the supporting portion 52. The metal wire 55 is electrically connected to the upper surface 53a of the lead terminal portion 53. The lower surface 52b of the supporting portion 52 and the lower surfaces 53b of the lead terminal portions 53 are not coated with the sealing resin 56 but are exposed.

However, in s semiconductor device 50 having such a structure, moisture contained in the atmosphere and the like penetrates into the semiconductor device 50 from a boundary surface between the lead terminal portion 53 and the sealing resin 56 exposed at the bottom surface of the semiconductor device 50. The moisture having penetrated into the semiconductor device 50 travels upwardly along the boundary surface. The moisture having penetrated from below the connecting portion between the lead terminal portion 53 and the metal wire 55 reaches the connecting portion between the lead terminal portion 53 and the metal wire 55. Further, such moisture travels between the metal wire 55 and the sealing resin 56 and reaches an Al pad, which is the electrode formed on the upper surface 54a of the semiconductor chip 54. It has been a problem to be solved that such moisture, containing ions such as $Cl^-$, $Fe^+$ and $Ni^+$, causes corrosion through chemical reaction with Al and has a harmful influence on the semiconductor device.

SUMMARY OF THE INVENTION

An object of the present invention is to provide a semiconductor device in which moisture penetrating from outside is hard to reach a semiconductor chip, and which has an excellent wet-proof property.

Another object of the present invention is to provide a lead frame to be applied to such a semiconductor device.

A semiconductor device according to the present invention comprises a lead frame having inner connecting portions and outer connecting portions, a semiconductor chip having electrodes on the surface thereof, metal wires for electrically connecting electrodes on the semiconductor chip and the inner connecting portions of the lead frame respectively, a sealing resin for sealing the inner connecting portions of the lead frame, the semiconductor element and the metal wires therein and at the same time exposing the outer connecting portions of the lead frame at the bottom surface thereof, and an inner connecting portion sealing resin for covering the inner connecting portion at the bottom side of the sealing resin.

According to the present invention, the lower portion of the inner connecting portion of the lead frame is covered or coated with the inner connecting portion sealing resin. Therefore, at this portion, the boundary surface of the lead frame and the sealing resin is not exposed, and moisture cannot penetrate into the semiconductor device from this portion. Moisture has to travel a longer distance in order to reach the connecting portion between the inner connecting portion and the metal wire, and accordingly, the traveling distance of moisture becomes the longer in order to reach the semiconductor chip. Therefore, such a semiconductor device has an excellent wet-proof property.

The lead frame may include a supporting portion on which the semiconductor chip is mounted, and lead terminal portions for connecting metal wires. In this case, the supporting portion and the lead terminal portions may be formed at the same height, or the supporting portion may be upset to be higher than the lead terminal portions. When the supporting portion is upset, the sealing resin can be also present below the supporting portion, so that the supporting portion can be firmly held by the sealing resin.

The upper surface area of the supporting portion may be equal to, larger or smaller than the bottom surface area of the semiconductor chip. When the supporting portion is smaller than the semiconductor chip, a larger area of the semiconductor chip is in direct contact with the sealing resin, and thereby detachment of the semiconductor chip from the supporting portion along the boundary surface therebetween can be reduced.

Further, the lead frame is exposed at the position other than the lower portion of the inner connecting portion to form an outer connecting portion. The semiconductor device can be mounted on a wiring substrate or the like by this outer connecting portion.

The end face of the lead frame on the peripheral side may be substantially in the same plane with the side surface of the sealing resin. In such a case, the outer connecting portion does not protrude from the sealing resin, so that the semiconductor device can be small-sized and the area occupied by the semiconductor device, when mounted on a wiring substrate, can be made smaller.

In one embodiment of the present invention, the metal wire is connected to the upper surface of the inner connecting portion, and the lower surface of the inner connecting portion is offset inwardly of the sealing resin with respect to the bottom surface of the sealing resin, while a part of the sealing resin enters in the underside of the inner connecting portion to form the inner connecting portion sealing resin.

With this structure, the inner connecting portion sealing resin is present in a space defined by the lower surface of the inner connecting portion offset inwardly of the sealing resin. Therefore, the bottom surface of the semiconductor device can be a substantially flat surface. Such a semiconductor device can be adequately surface-mounted.

Further, since the inner connecting portion sealing resin is the sealing resin having entered in the underside of the inner connecting portion, these resins are of the same kind. Consequently, these resins can be formed at the same time, thereby to improve productivity.

The inner connecting portion may have such a structure that the upper surface is flat with only the lower surface being offset, or that both of the upper and lower surfaces are offset.

A step may be formed between the lower surface of the outer connecting portion and the lower surface of the inner connecting portion.

Further, a tapered surface, which comes upwardly as it comes inwardly of the sealing resin, may be provided on the lower surface the inner connecting portion.

Such a structure of the inner connecting portion, for example, can be obtained only by machining the head of one end of the lead terminal portion. As a result, the semiconductor device according to the present invention has a simple structure and can be fabricated at a low cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
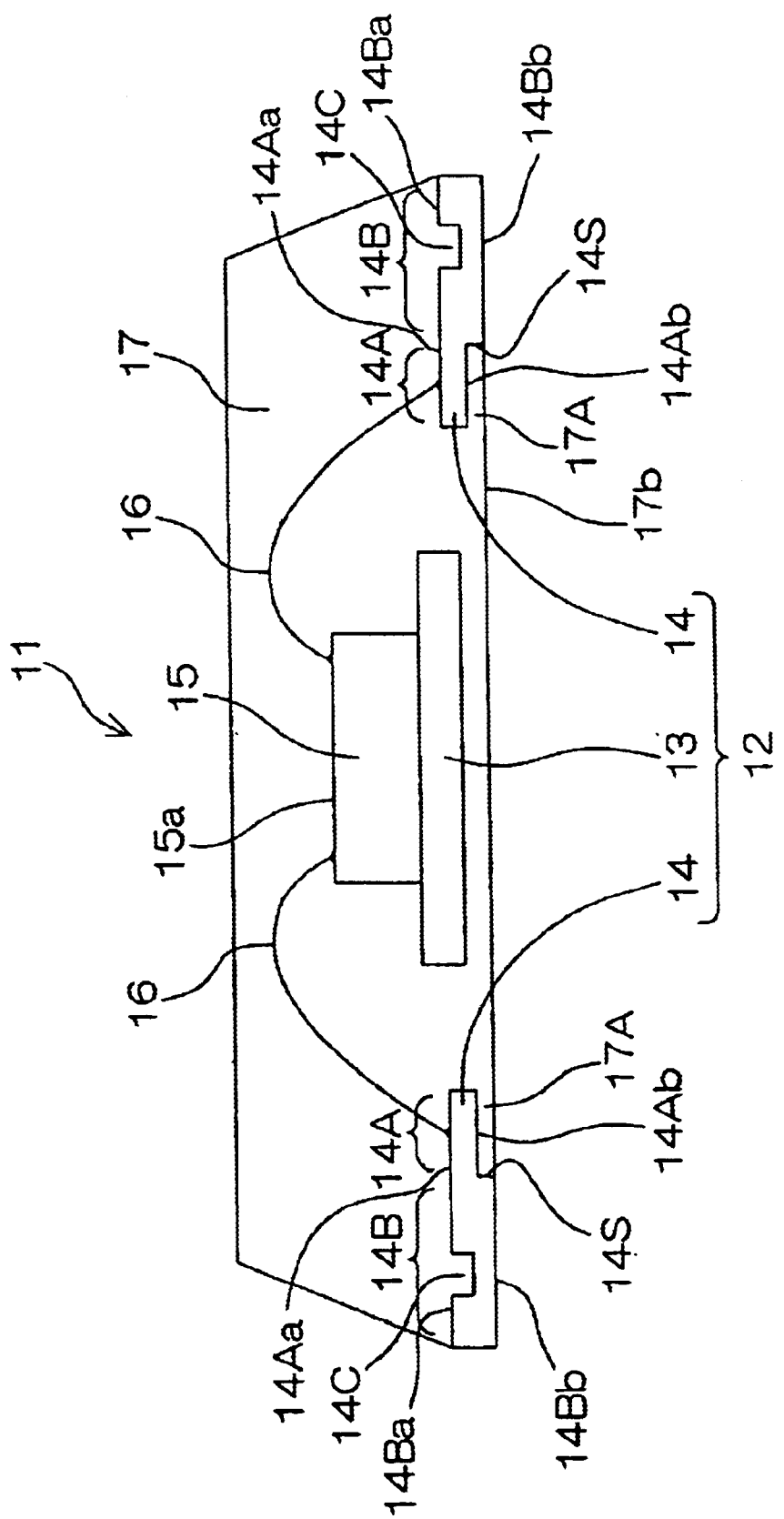
FIG. 1 is a schematic sectional view showing the structure of a one-side sealed type semiconductor device according to a first embodiment of the present invention.

FIG. 1 is a schematic sectional view showing the structure of a semiconductor device 11 according to the first embodiment of the present invention.

This semiconductor device 11 comprises a lead frame 12 having a supporting portion 13 and lead terminal portions 14, a semiconductor chip 15 mounted on the supporting portion 13, metal wires 16 for electrically connecting electrodes formed on the upper surface 15a of the semiconductor chip 15 and lead terminal portions 14 respectively, and a sealing resin 17 for sealing the semiconductor chip 15, metal wires 16, the supporting portions 13 and upper surface 14A$a$, 14B$a$ of the lead terminal portions 14.

The lead frame 12 has such a structure that the supporting portion 13 is disposed in the central portion thereof, and the lead terminal portions 14 are surrounding the supporting portion 13. The lead frame 12 is upset so that the supporting portion 13 is disposed at a higher position than the lead terminal portions 14.

The lead terminal portion 14 comprises an inner connecting portion 14A on the semiconductor chip 15 side it and an outer connecting portion 14B on the peripheral side. The metal wire 16 is connected to the upper surface 14A$a$ of the inner connecting portion 14A. A step 14S is provided between a lower surface 14A$b$ of the inner connecting portion 14A and a lower surface 14B$b$ of the outer connecting portion 14B, and the lower surface 14A$b$ of the inner, connecting portion 14A is upwardly offset. Thereby, an inner connecting portion sealing space 17A is provided below the inner connecting portion 14A. The sealing resin 17 enters in this inner connecting portion sealing space 17A and can serve as an inner connecting portion sealing resin coating the lower surface of the inner connecting portion 14A. The upper surface 14A$a$ of the inner connecting portion 14A and the upper surface 14B$a$ of the outer connecting portion 14B are in the same plane with each other. Such a shape of the lead terminal portion 14 can be formed by a mechanical or chemical treatment.

The lower surface 14B$b$ of the outer connecting portion 14B is in the same plane with the lower surface 17$b$ of the sealing resin 17 and is exposed from the sealing resin 17 to form an outer lead portion. That is, the bottom surface of this semiconductor device 11 is a flat surface. The end face, on the peripheral part side, of the lead terminal portion 14 is disposed substantially in the same plane with the side surface of the sealing resin 17.

Figure 2:
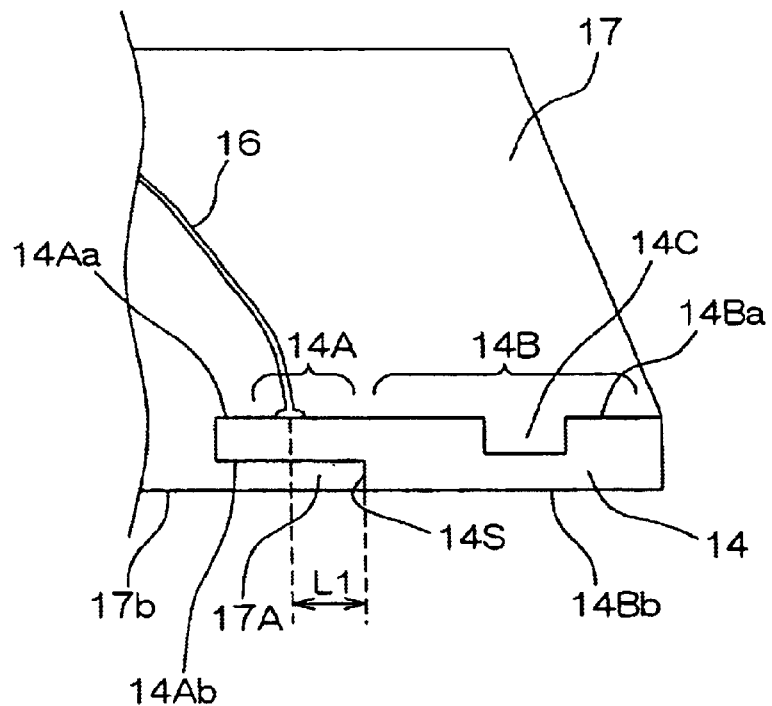
FIG. 2 is an enlarged schematic sectional view showing a part in the vicinity of a connecting portion between a lead terminal portion and a metal wire shown in FIG. 1.

FIG. 2 is an enlarged schematic sectional view showing a part in the vicinity of the connecting portion between the inner connecting portion 14A and the metal wire 16.

The metal wire 16 is connected to the upper surface 14A$a$ of the inner connecting portion 14A at a position spaced apart by a distance L1 from the boundary between the inner connecting portion 14A and the outer connecting portion 14B (the position of step 14S) toward the central portion side of the semiconductor device 11 (semiconductor chip 15 side). On the upper surface 14B$a$ of the of the outer connecting portion 14B, a groove 14C is provided perpendicular to the, longitudinal direction of the lead terminal portion 14. The inside of the groove 14C is filled with the sealing resin 17.

At the bottom surface of a semiconductor device 11 having such a structure, moisture cannot penetrate into the inside of the semiconductor device 11 due to the sealing resin 17 present below the inner connecting portion 14A. Therefore, in order to reach the connecting portion between the inner connecting portion 14A and the metal wire 16, moisture has to take a long way around the exposed portion of the boundary surface between lead terminal portion 14 and the sealing resin. 17. Therefore, in comparison with the conventional semiconductor device 50, moisture has to travel a longer distance by a distance L1 in addition to a distance corresponding to the thickness of the lead terminal portion 14. As a result, in order to reach the semiconductor chip 15, moisture has to travel a longer distance, and consequently, such a semiconductor device 11 has an excellent wet-proof property.

Further, in such a semiconductor device 11, the lead terminal portion 14 does not protrude from the peripheral part. Therefore, the mounting area of the semiconductor device 11, when mounted on a wiring substrate, can be smaller. In such a case, at least apart of the lower surface 14B*b* of the outer connecting portion 14B can be bonded as an outer terminal on a connecting pad of the wiring substrate using a cream solder or the like.

Further, in such a semiconductor device 11, since the lead frame 12 is upset, the sealing resin 17 is present below the supporting portion 13. In addition, since the sealing resin 17 enters in the underside of the inner connecting portion 14A, the lead frame 12 is hard to be detached off from the sealing resin 17. Furthermore, since the groove 14*c* is provided, the lead terminal portion 14 is hard to be pulled out in the direction toward the peripheral part (the direction toward the lateral side of the semiconductor device 11).

Figure 3:
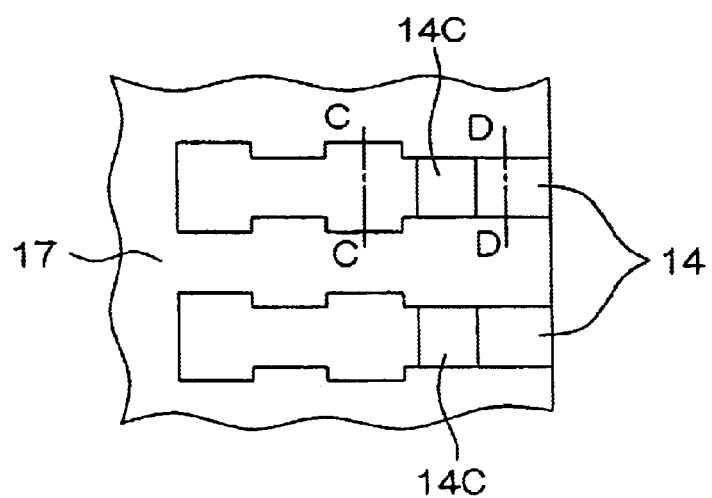
FIG. 3 is a plan view of the lead terminal portion shown in FIG. 1.

FIG. 3 is a plan view of the lead terminal portion 14. Step portions are provided at the lateral sides of each lead terminal portion 14. That is, the lead terminal portion 14 has two wide portions and two narrow portions alternately disposed at shifted positions in the longitudinal direction thereof. With such a shape, the lead terminal portion 14 is hard to be pulled out toward the peripheral side.

Figure 4A:
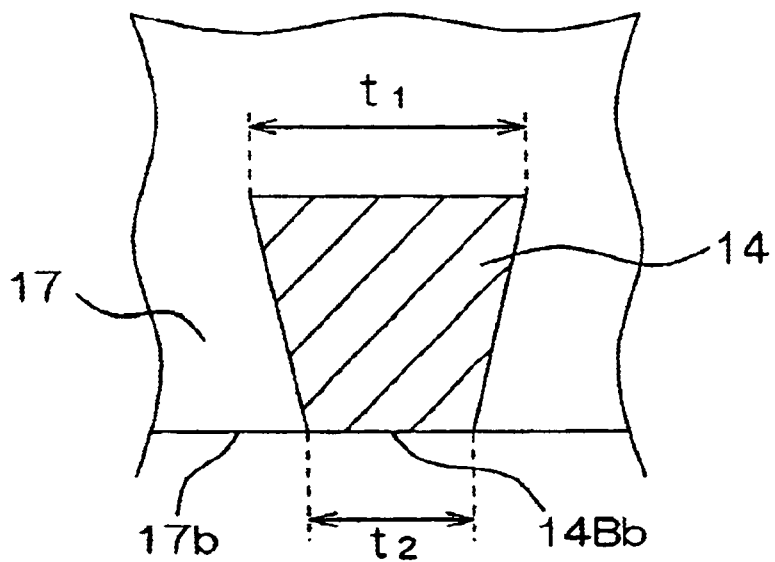
FIG. 4A is a sectional view taken along the cutting line C—C in FIG. 3.
Figure 4B:
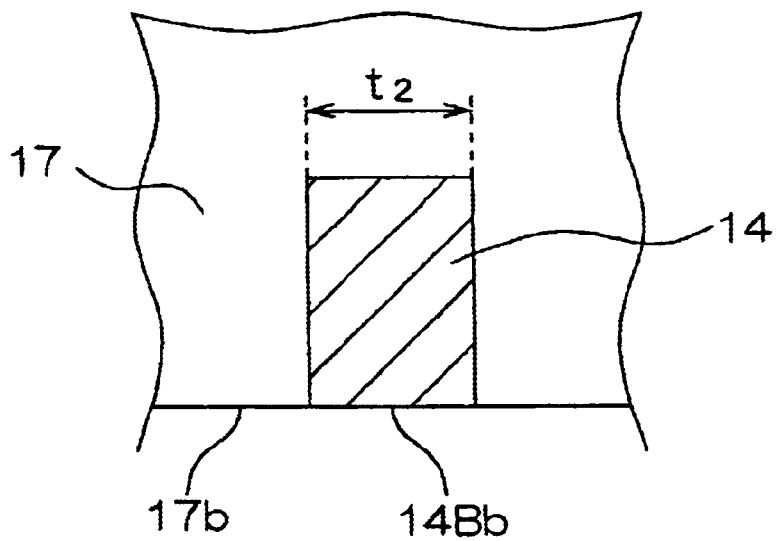
FIG. 4B is a sectional view taken along the cutting line D—D in FIG. 3.

FIG. 4A is a sectional view taken along the cutting line C—C of FIG. 3 and FIG. 4B is a sectional view taken along the cutting line D—D of FIG. 3.

The section along the cutting line C—C is a section of the wide portion of the lead terminal portion 14, and is in the shape of an inverted trapezoid the upper side of which has a length t1 and the lower side of which has a length t2 (t1>t2)(FIG. 4A).

The section along the cutting line D—D is a section of the narrow portion of the lead terminal portion 14, and is in the shape of a rectangle having a width t2 (FIG. 4B). That is, the upper surface of the lead terminal portion 14 has different two widths t1 and t2 at shifted positions in the longitudinal direction thereof, but the bottom surface thereof has the fixed width t2.

At the wide portion having an inverted trapezoidal section (FIG. 4A), the lead terminal portion 14 is wider in the sealing resin 17 and has tapered surfaces opposed to the bottom surface 17*b* side of the sealing resin 17. With this structure, the lead terminal portion 14 is also hard to be detached off from the sealing resin 17.

Figure 5:
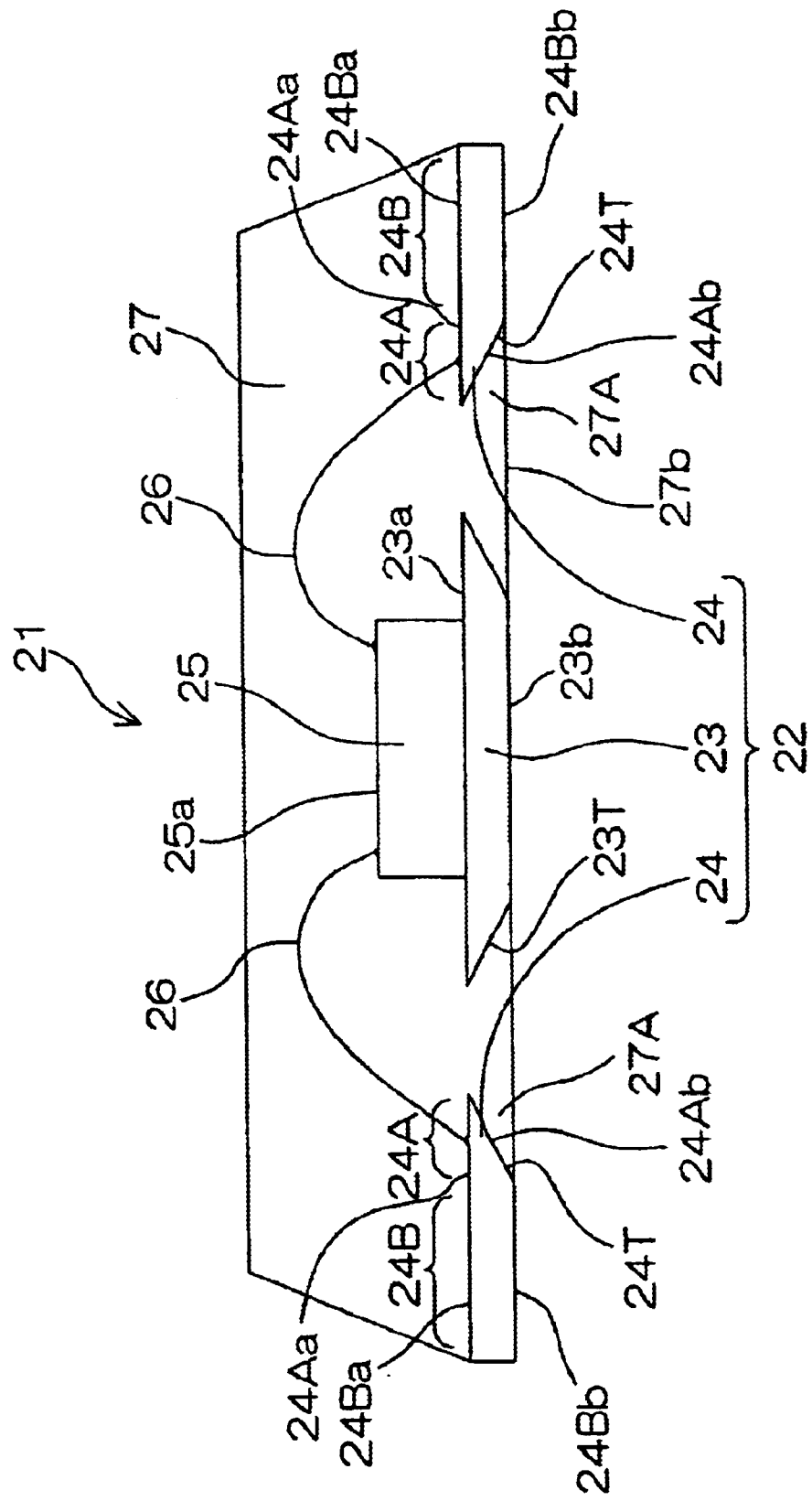
FIG. 5 is a schematic sectional view showing the structure of a one-side sealed type semiconductor device according to a second embodiment of the present invention.

FIG. 5 is a schematic sectional view showing the structure of a semiconductor device 21 according to the second embodiment of the present invention.

This semiconductor device 21 comprises a lead frame 22 having a supporting portion 23 and lead terminal portions 24, a semiconductor chip 25 mounted on the supporting portion 23, metal wires 26 for electrically connecting electrodes formed on the upper surface 25*a* of the semiconductor chip 25 and lead terminal portions 24 respectively, and a sealing resin 27 for sealing the semiconductor chip 25, metal wires 26, the upper surface 23*a* of the supporting portions 23 and upper surface 24A*a*, 24B*a* of the lead terminal portions 24.

The lead frame 22 has such a structure that the supporting portion 23 is disposed in the central portion thereof, and lead terminal portions 24 are surrounding the supporting portion 23. The supporting portion 23 and the lead terminal portions 24 are disposed at the same height.

The lead terminal portion 24 comprises an inner connecting portion 24A on the semiconductor chip 25 side and an outer connecting portion 24B on the peripheral side. The metal wire 26 is connected to the upper surface 24A*a* of the inner connecting portion 24A. A tapered surface 24T, which comes closer to the supporting portion 23 as it comes upwardly, is provided between a lower surface 24B*b* of the outer connecting portion 24B and a lower surface 24A*b* of the inner connecting portion 24A, and the lower surface 24A*b* of the inner connecting portion 24A is upwardly offset. Thereby, an inner connecting portion sealing space 27A is provided below the inner connecting portion 24A. In this embodiment, the lower surface 24B*b* is a tapered surface in continuation with the tapered surface 24T.

The sealing resin 27 enters in this inner connecting portion sealing space 27A. The upper surface 24A*a* of the inner connecting portion 24A and the upper surface 24B*a* of the outer connecting portion 24B are in the same plane with each other. Such a shape of the lead terminal portion 24 can be formed by a mechanical or chemical treatment.

The lower surface 24B*b* of the outer connecting portion 24B is in the same plane with the lower surface 27*b* of the sealing resin 27 and is exposed from the sealing resin 27. That is, the bottom surface of this semiconductor device 21 is a flat surface. The end face, on the peripheral part side, of the lead terminal portion 24 is disposed substantially in the same plane with the side surface of the sealing resin 27.

Further, at the peripheral part of the supporting portion 23, a tapered surface 23T, which comes upwardly as it comes outwardly of the supporting portion 33, is formed, and the sealing resin 27 enters below the tapered surface 23T.

Figure 6:
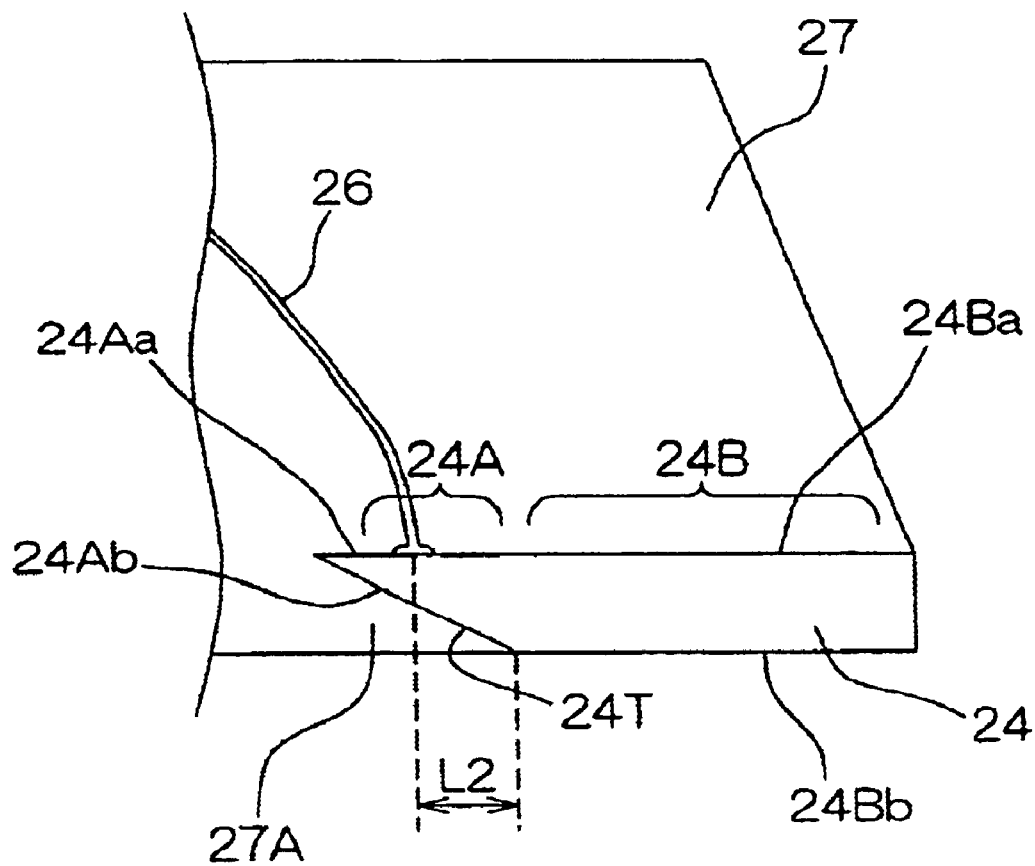
FIG. 6 is an enlarged schematic sectional view showing a part in the vicinity of a connecting portion between a lead terminal portion and a metal wire shown in FIG. 5.
Figure 7:
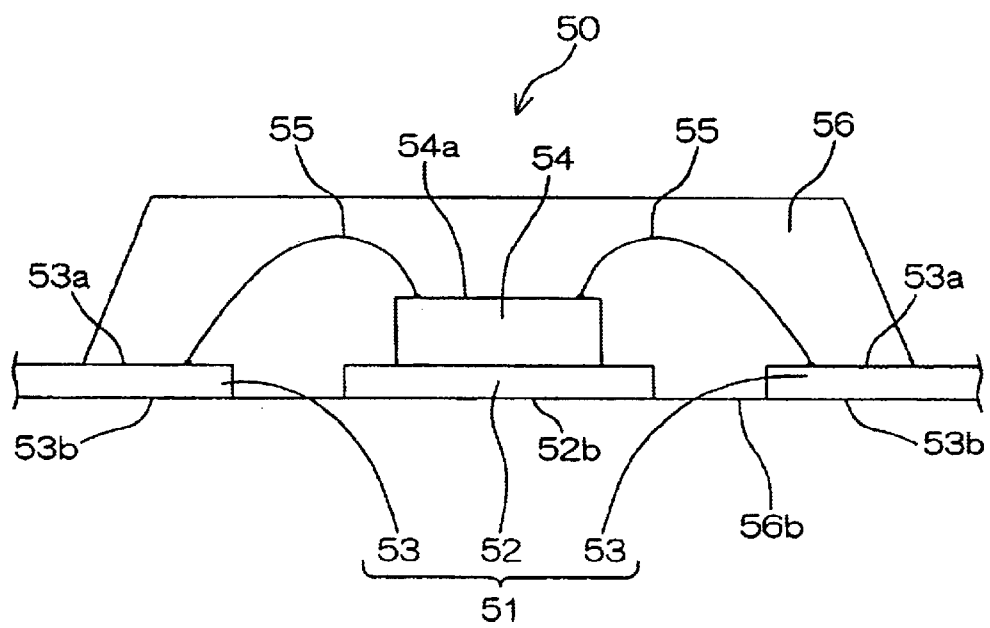
FIG. 7 is a schematic sectional view showing the structure of a conventional one-side sealed type semiconductor device.

FIG. 6 is an enlarged schematic sectional view showing a part in the vicinity of the connecting portion between the inner connecting portion 24A and the metal wire 26.

The metal wire 26 is connected to the upper surface 24A*a* of the inner connecting portion 24A at a position spaced apart by a distance L2 from the boundary between the inner connecting portion 24A and the outer connecting portion 24B toward the central portion side of the semiconductor device 21 (semiconductor chip 25 side).

In a semiconductor device 21 having such a structure, due to the presence of distance L2, outside moisture has to take a longer way in order to reach the connecting portion between the inner connecting portion 24A and the metal wire 26, in comparison with the conventional semiconductor device 50. Therefore, such a semiconductor device 21 has an excellent wet-proof property.

Such a semiconductor device 21 can be mounted on a connecting pad of a wiring substrate, with at least a part of the lower surface 24B*b* of the outer connecting portion 24B or the lower surface 23*b* of the supporting portion 23 serving as an outer terminal.

Further, at the end of the supporting portion 23 and at the end, on the semiconductor chip 25 side, of the lead terminal portion 24, the sealing resin 17 enters around and is present below the tapered surfaces 23T, the lead frame 22 is hard to be detached off from the sealing resin 27.

Though only the lower surface of the inner connecting portion is upwardly offset in the abovementioned embodiments, both of the upper and lower surfaces of the inner connecting portion may be upwardly offset. That is, it is possible to upset one end (for example, the end on the side of the central portion of the semiconductor device) of the lead terminal portion by bending or the like, to form an inner connecting portion the upper surface of which is connected with a metal wire. In a semiconductor device having such a structure, the wet-proof property thereof can be improved by filling the inner connecting portion sealing space defined below the inner connecting portion with a sealing resin.

Further, in the abovementioned embodiments, the lower surface of the inner connecting portion is offset inwardly of the sealing resin, and the bottom surface of the semiconductor device is formed to be substantially flat. However, it is possible that the lower surface of the inner connecting portion is not offset but is coated with an inner connecting portion coating resin so as to slightly protrude from the bottom surface of the semiconductor device. That is, the inner connecting portion can be coated with an inner connecting portion sealing resin so that the boundary surface between the lead terminal portion and the sealing resin is not exposed at a position below the connecting portion between the inner connecting portion and the metal wire. The inner connecting portion sealing resin and the sealing resin may be of the same kind or different kinds. In a semiconductor device having such a structure, the traveling distance of moisture also becomes longer in comparison with that of the conventional semiconductor device, and therefore, the wet-proof be improved.

Although the embodiments of the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No. 2000-308925 filed in the Japanese Patent Office on Oct. 10, 2000, and the entire disclosure of the Japanese application is incorporated herein by reference.

What is claimed is:

1. A semiconductor device comprising:
   a lead frame having inner connecting portions and outer connecting portions;
   a semiconductor chip having electrodes on a surface thereof;
   metal wires for electrically connecting the electrodes on the semiconductor chip and the inner connecting portions of the lead frame;
   a sealing resin for sealing the inner connecting portions of the lead frame, the semiconductor chip and the metal wires therein, and at the same time exposing the outer connecting portions of the lead frame at a bottom surface thereof; and
   an inner connecting portion sealing resin for covering the inner connecting portion at the bottom side of the sealing resin wherein
   the inner connecting portion sealing resin exists beneath the connecting portion of the inner connecting portion with the metal wires;
   each of the metal wires is banded to an upper surface of the inner connecting portion;
   a lower surface of the inner connecting portion is offset inwardly of the sealing resin with respect to the bottom surface of the sealing resin;
   a groove is provided on an upper surface of the outer connecting portion, the groove being perpendicular to a longitudinal direction of a lead terminal portion including the inner connecting portion and the outer connecting portion; and
   a part of the sealing resin enters an underside of the inner connecting portion to form the inner connecting portion sealing resin.

2. A semiconductor device as claimed in claim 1 in which a step is formed between a lower surface of the outer connecting portion and the lower surface of the inner connecting portion.

3. A semiconductor device as claimed in claim 1 in which a bottom surface of the outer connecting portion is exposed from the bottom surface of the sealing resin to form an outer lead portion.

4. A lead frame comprising:
   a supporting portion for supporting a semiconductor chip; and
   lead terminal portions each having an inner connecting portion to be electrically connected to the semiconductor chip to be mounted on the supporting portion and an outer connecting portion for outer connection;
   a lower surface of the inner connecting portion being offset with respect to a lower surface of the outer connecting portion so that an inner connecting portion sealing space is defined below the inner connecting portion; wherein
   an area for electrically connecting the semiconductor chip is provided above the inner connecting portion sealing spice;
   a groove is provided on an upper surface of the outer connecting portion, the groove being perpendicular to a longitudinal direction of the lead terminal portion.

5. A lead frame as claimed in claim 4 in which a step is formed between the lower surface of the outer connecting portion and the lower surface of the inner connecting portion.

6. A semiconductor device as claimed in claim 1 in which the lead terminal portion has a wide portion and a narrow portion at sifted positions in the longitudinal direction thereof in plan view.

7. A semiconductor device as claimed in claim 1 in which at least a part of the lead terminal portion has a section in a shape of an inverted trapezoid.

8. A semiconductor device as claimed in claim 7 in which the lead terminal portion has a wide portion and a narrow portion at sifted positions in the longitudinal direction thereof in plan view.

9. A lead frame as claimed in claim 4 in which the lead terminal portion has a wide portion and a narrow potion at sifted positions in the longitudinal direction thereof in plan view.

10. A lead frame as claimed in claim 4 in which at least a part of the lead terminal portion has a section in a shape of an inverted trapezoid.

11. A lead frame as claimed in claim 10 in which the lead terminal portion has a wide portion and a narrow portion at sifted positions in the longitudinal direction thereof in plan view.

12. A semiconductor device comprising:
   a lead frame having inner connecting portions and outer connecting portions;
   a semiconductor chip having electrodes on a surface thereof;
   metal wire for electrically connecting the electrodes on the semiconductor chip and the inner connecting portions of the lead frame;
   a sealing resin for sealing the inner connecting portions of the lead frame, the semiconductor chip and the metal wires therein, and at the same time exposing the outer connecting portions of the lead frame at a bottom surface thereof; and
   an inner connecting portion sealing resin for covering the inner connecting portion at the bottom side of the sealing resin; wherein
   the inner connecting portion sealing resin exist beneath the connecting portion of the inner connecting portion with the metal wires;
   each of the metal wires is bonded to an upper surface of the inner connecting portion;

lower surface of the inner connecting portion is offset inwardly of the sealing resin with respect to the bottom surface of the sealing resin;

at least a part of a lead terminal portion including the inner connecting portion and the outer connecting portion has a section in a shape of an inverted trapezoid; and a part of the sealing resin enters an underside of the inner connecting portion to form the inner connecting portion sealing resin, in which a step is formed between a lower surface of the outer connecting portion and the lower surface of the inner connecting portion.

13. A lead frame, comprising:

a supporting portion for supporting a semiconductor chip; and lead terminal portions each having an inner connecting portion to be electrically connected to the semiconductor chip to be mounted on the supporting portion and an outer connecting portion for outer connection;

a lower surface of the inner connecting portion being offset with respect to a lower surface of the outer connecting portion so that an inner connecting portion sealing space is defined below the inner connecting portion; wherein an area for electrically connecting the semiconductor chip is provided above the inner connecting portion sealing space, at least part of the lead terminal portion has a section in a shape of an inverted trapezoid, in which a step is formed between the lower surface of the outer connecting portion and the lower surface of the interconnecting portion.

* * * * *